United States Patent [19]

Förster et al.

[11] 4,104,569
[45] Aug. 1, 1978

[54] HORIZONTAL DEFLECTION CIRCUIT WITH AUXILIARY POWER SUPPLY

[75] Inventors: Gerhard Förster, Würenlos; Walter Bohringer, Schlieren, both of Switzerland

[73] Assignee: RCA Corporation, New York, N.Y.

[21] Appl. No.: 783,216

[22] Filed: Mar. 31, 1977

[30] Foreign Application Priority Data

Apr. 26, 1976 [GB] United Kingdom ............... 16868/76

[51] Int. Cl.² .................... H01J 29/70; H01J 29/76
[52] U.S. Cl. ...................................... 315/408; 315/399
[58] Field of Search ........................ 315/399, 408, 410

[56] References Cited

U.S. PATENT DOCUMENTS 3,950,673  4/1976  Gries ..................................... 315/408

*Primary Examiner*—Maynard R. Wilbur
*Assistant Examiner*—T. M. Blum
*Attorney, Agent, or Firm*—E. M. Whitacre; P. J. Rasmussen; J. Laks

[57] ABSTRACT

A deflection circuit for a television receiver comprises a deflection winding coupled to commutating and trace switches. A reactive circuit including a capacitor is coupled between the switches. A transient voltage damping circuit is coupled across the commutating switch. The damping circuit includes a transformer comprising a primary winding to which the transient voltages are coupled and a secondary winding coupled to an auxiliary load circuit.

7 Claims, 3 Drawing Figures

HORIZONTAL DEFLECTION CIRCUIT WITH AUXILIARY POWER SUPPLY

BACKGROUND OF THE INVENTION

This invention relates to television receiver deflection circuits.

In SCR deflection circuits, transient voltages appear across the commutating switch when the switch becomes nonconductive. The magnitude and duration of these voltages are damped, typically by placing a series RC damping network across the switch. Nonetheless, the SCR device in the commutating switch is exposed to rapidly changing voltages when the switch turns off. For B+ voltages of about 270 volts, which are available in many European SCR deflection circuits, the SCR must be fabricated to withstand $dv/dt$ values of from 400V/μs to 1200V/μs.

The resistive component of the RC damping network dissipates considerable power as waste heat, typically from 10 to 15 watts. Optimization of the damping network is difficult, as the $dv/dt$ ratings of the SCR's will vary when obtained from various sources. Thus, optimization of the damping network for an SCR with one $dv/dt$ rating will result in an increased power loss for an SCR with a different $dv/dt$ rating.

It is desirable, therefore, to develop a transient voltage damping network for the commutating switch that results in relatively low $dv/dt$ values and also beneficially uses the power developed in the transient damping network instead of uselessly dissipating the power as waste heat.

SUMMARY OF THE INVENTION

A deflection circuit for a television receiver comprises a deflection winding coupled to first and second controllable switches. The switches are arranged for conducting during respective first and second portions of each deflection cycle. A reactive circuit, including energy storage capacitance, is coupled between the switches. A damping circuit is coupled to the first switch for damping transient voltages developed across the first switch. The damping circuit includes a first inductor to which the transient voltages are coupled and a load circuit coupled to the first inductor.

DESCRIPTION OF THE INVENTION

Figure 1:
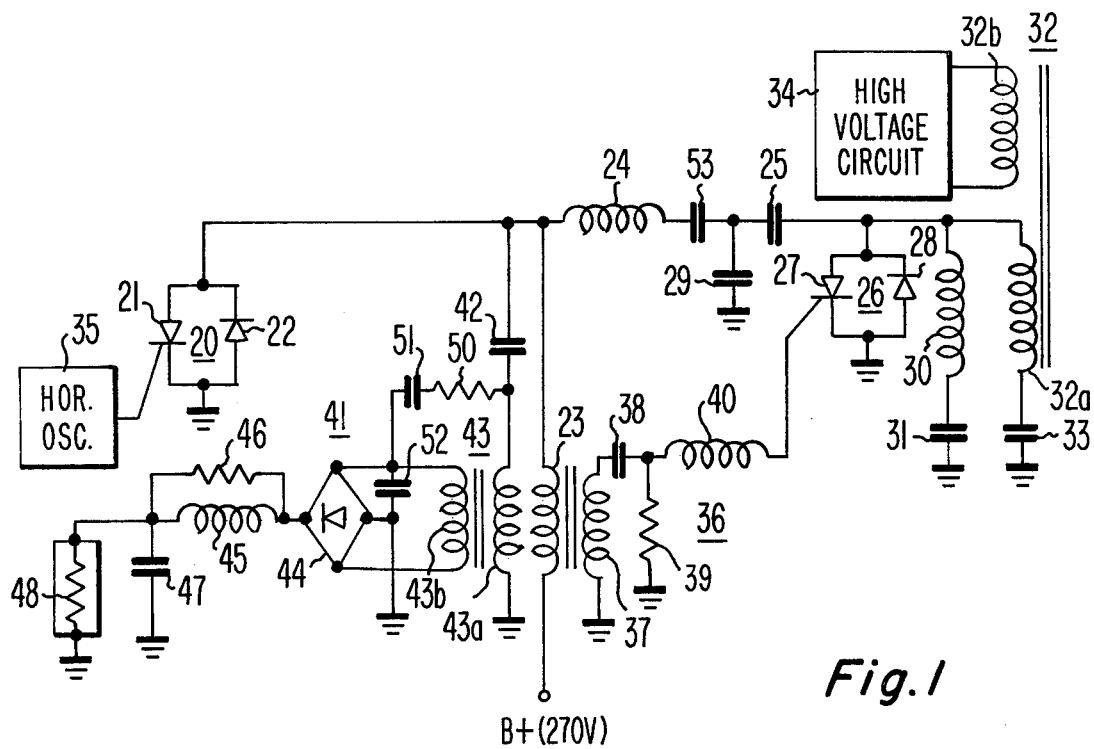
FIG. 1 illustrates a deflection circuit embodying the invention.

An SCR deflection system which embodies the invention is illustrated in FIG. 1. The deflection system is retrace driven and similar to the one disclosed in U.S. Pat. No. 3,452,244, granted to W. F. W. Dietz. A commutating switch 20 comprises a silicon controlled rectifier, SCR 21 and an oppositely poled diode 22. The commutating switch 20 is coupled through an input choke 23 to a source of B+ voltage, illustratively shown as 270 volts.

Commutating switch 20 is coupled through a commutating inductor 24, commutating capacitors 25 and 53 and a trace switch 26 to ground. Trace switch 26 comprises an SCR 27 and an oppositely poled damper diode 28. A capacitor 29 is coupled between the junction of capacitor 53 and capacitor 25 and ground.

A series combination of horizontal deflection winding 30 and an "S" shaping capacitor 31 are coupled in parallel with trace switch 26. Also coupled in parallel with trace switch 26 is a series combination of a primary winding 32a of a horizontal output transformer 32 and a DC blocking capacitor 33. A high voltage secondary winding 32b of transformer 32 couples relatively large amplitude retrace pulses to a high voltage circuit 34 for developing a DC high voltage for use as the ultor voltage of a kinescope, not shown.

A horizontal oscillator 35 is coupled to the gate electrode of commutating SCR 21 and produces a gating pulse during each deflection cycle slightly before the end of the trace interval for turning on SCR 21, thereby initiating the commutating interval. A waveshaping network 36 comprising an inductor 37 magnetically coupled to choke 23, a capacitor 38, a differentiating resistor 39, and a smoothing inductor 40 is coupled to the gate of trace SCR 27. The waveshaping network 36 couples a gating signal to SCR 27 to enable the SCR for conduction during the second half of the trace interval.

A transient voltage damping network 41, according to the invention, is coupled across commutating switch 20 for damping transient voltages when the switch turns off as, for example, at the end of the commutating interval, as will be further explained. Transient voltage damping network 41 comprises a series coupled capacitor 42 and a primary winding 43a of a transformer 43. A bypass capacitor 52 couples a secondary winding 43b to ground. Secondary winding 43b is coupled to a load circuit comprising a rectifier circuit 44, an input choke inductor 45, across which is coupled a damping resistor 46, and a filter capacitor 47. The filtered output voltage across capacitor 47 serves as an auxiliary supply voltage for a load, illustratively shown as a resistor 48.

Figure 2A:
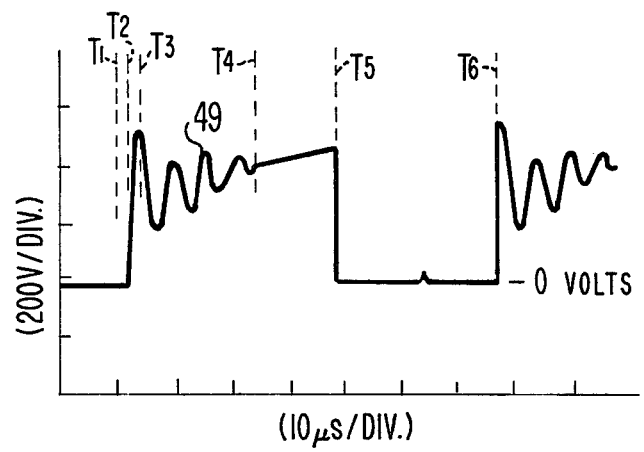
FIGS. 2a — 2b are waveforms associated with the circuit of FIG. 1.

The voltage across commutating switch 20 is illustrated in FIG. 2a. At time $T_1$, shortly after the beginning of the trace interval but towards the end of the commutating interval, both commutating switch 20 and trace switch 26 are conducting. Positive current is flowing upward in FIG. 1 through diode 22 in a first resonant circuit formed by commutating inductor 24, capacitor 53 and capacitor 25 and in a second resonant circuit formed by commutating inductor 24, capacitor 53 and capacitor 29.

At time $T_2$, the resonating current has charged capacitors 53, 25 and 29, and the current through diode 22 has decreased to zero. Diode 22 cuts off, ending the commutating interval. The resonating currents now circulate through capacitor 42 and primary winding 43a of transient damping network 41. The load 48 is reflected back into the primary as a resistance in series with capacitor 42. The transient resonant voltage 49 across switch 20 is damped, as shown in FIG. 2a from times $T_2 - T_4$, the voltage reaching a maximum at time $T_3$. The commutating interval begins again at time $T_5$ near the end of the trace interval and lasts until time $T_6$.

The magnitude of the portion of transient voltage 49 developed across primary winding 43a can be chosen by appropriate selection of the capacitance of capacitor 42 and/or by selection of the inductance of primary winding 43a and/or by the winding turns ratio of transformer 43. For the values of selected components listed in the table below, any auxiliary supply voltage between about 12 volts and 300 volts can be obtained.

With the below given values and a load resistance of 56 ohms for resistor 48, the auxiliary supply voltage across filter capacitor 47 is 27 volts, with the load drawing 0.48 amps current, for a useful power consumption of 13.0 watts. A load which draws smaller load current corresponding to a higher transformed value for the load resistor produces a greater damping of the transient voltages.

Figure 2B:
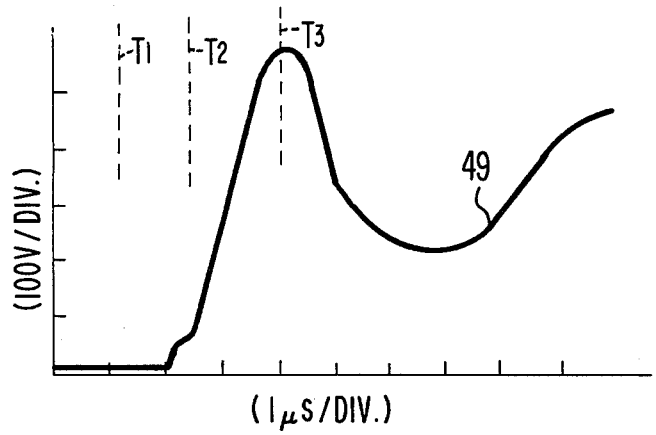

In FIG. 2b, the waveform of FIG. 2a is shown on an expanded time scale. The peak voltage developed across commutating switch 20 is 580 volts with a $dv/dt$ of only about 300V/μs. Thus, by coupling a transformer in the transient voltage damping network across switch 20 instead of coupling a conventional series RC network, useful power can be developed in an auxiliary power supply. Proper damping of the transient voltages results and an appropriate $dv/dt$ for switch 20 can be obtained.

Inductor 45 limits the peak inrush currents to capacitor 47 during initial operation and prevents the reactance of capacitor 47 from being reflected back to the primary of transformer 43. In designing transformer 43, the leakage inductance should be kept as low as possible to avoid unwanted high frequency oscillations. For this purpose, the oscillations may be suppressed by an RC network coupled between the primary and secondary windings of transformer 43. As shown in FIG. 1, the RC network comprises a resistor 50 and a capacitor 51.

TABLE

| | |
|---|---|
| Resistor 46 | 10KΩ |
| Resistor 48 | 56Ω |
| Resistor 50 | 150Ω |
| Capacitor 42 | 6.8nf |
| Capacitor 47 | 2200μf |
| Capacitor 51 | 3.3nf |
| Capacitor 52 | 10nf |
| Inductor 45 | 200μH |
| B+ Voltage | 270V |
| Voltage Across Capacitor 47 | 27 volts |
| Transformer 43: | |
| Ferrite UU core 20 × 15 × 8mm | |
| Primary & Secondary Windings 43a and 43b: | |
| Bifilar wound, each winding 70 turns of 0.6mm diameter enamelled copper wire | |
| Primary & Secondary Inductances: | 5.7mH |
| Leakage Inductance: | 2μH |

What is claimed is:

1. A deflection circuit for a television receiver comprising:
    a deflection winding;
    first and second controllable switching means coupled to said deflection winding and arranged for conducting during respective first and second portions of each deflection cycle;
    reactive circuit means coupled between said first and second switching means, said reactive circuit means comprising an energy storage capacitance coupled to a commutating inductance; and
    first damping means coupled to said first switching means for damping transient voltages across said first switching means, said damping means including a first inductance to which said transient voltages are coupled; and a load circuit coupled to said first inductance, the reflected impedance of said load circuit as developed by said first inductance selected to provide substantially all of the transient voltage damping across said first switching means.

2. A circuit according to claim 1 including a second inductor magnetically coupled to said first inductor, said load circuit coupled magnetically to said first inductor by said second inductor.

3. A circuit according to claim 1 wherein said first damping means includes a capacitor coupled to said first inductor.

4. A circuit according to claim 3 wherein second damping means is coupled between said first and second inductors for damping voltage oscillations caused by leakage inductance of said magnetically coupled inductors.

5. A circuit according to claim 1 wherein said first switching means comprises a controlled rectifier and a diode poled to conduct in a direction opposite to said rectifier, said transient voltages occurring when said diode switches from one conductive state to another.

6. A circuit according to claim 1 wherein said load circuit comprises:
    rectifying means coupled to said second inductor;
    an input inductor coupled to said rectifying means; and
    a filter capacitor coupled to said input inductor for coupling to a load.

7. A deflection circuit for a television receiver comprising:
    a deflection winding;
    first and second controllable switching means coupled to said deflection winding and arranged for conduction during respective first and second portions of each deflection cycle;
    reactive circuit means coupled between said first and second switching means, said reactive circuit means comprising an energy storage capacitance coupled to a commutating inductance;
    an input inductance coupled to a selected one of said first and second controllable switching means for coupling the selected controllable switching means to a source of energy;
    a waveshaping circuit coupled to a source of deflection rate voltage and a designated one of said first and second controllable switching means for controlling conduction of the designated controllable switching means; and
    first damping means coupled to said first switching means for damping transient voltages across said first switching means, said first damping means including transformer means comprising a primary winding to which said transient voltages are coupled; and a secondary winding for coupling a load circuit, the reflected impedance of said load circuit selected to substantially decrease the transient voltage stress across said first switching means.

* * * * *